United States Patent
Higashijima et al.

(10) Patent No.: US 8,696,863 B2
(45) Date of Patent: Apr. 15, 2014

(54) LIQUID PROCESSING APPARATUS AND LIQUID PROCESSING METHOD

(75) Inventors: Jiro Higashijima, Koshi (JP); Hiromitsu Namba, Koshi (JP)

(73) Assignee: Tokyo Electron Limited, Tokyo (JP)

(*) Notice: Subject to any disclaimer, the term of this patent is extended or adjusted under 35 U.S.C. 154(b) by 486 days.

(21) Appl. No.: 12/703,868

(22) Filed: Feb. 11, 2010

(65) Prior Publication Data
US 2010/0200547 A1   Aug. 12, 2010

(30) Foreign Application Priority Data
Feb. 12, 2009   (JP) .................. 2009-029772

(51) Int. Cl.
*B08B 3/08* (2006.01)
*B08B 3/04* (2006.01)

(52) U.S. Cl.
USPC ............................ 156/345.55; 156/345.21

(58) Field of Classification Search
USPC ...................... 156/345.55, 345.21
See application file for complete search history.

(56) References Cited

U.S. PATENT DOCUMENTS

2006/0021636 A1* 2/2006 Miya .................... 134/33
2007/0240824 A1* 10/2007 Kaneko et al. .......... 156/345.11
2008/0110861 A1* 5/2008 Kajita et al. ............ 216/83
2009/0205155 A1* 8/2009 Itoh et al. .............. 15/320
2010/0200547 A1* 8/2010 Higashijima et al. .... 156/345.21

FOREIGN PATENT DOCUMENTS

| JP | 9-298181 A | 11/1997 |
|---|---|---|
| JP | 10-057877 A | 3/1998 |
| JP | 10-135178 A | 5/1998 |
| JP | 10-137664 A | 5/1998 |
| JP | 2001-068443 A | 3/2001 |
| JP | 2001068443 A * | 3/2001 |
| JP | 2003-045839 A | 2/2003 |
| JP | 2008-112760 A | 5/2008 |

* cited by examiner

*Primary Examiner* — Sylvia R MacArthur
(74) *Attorney, Agent, or Firm* — Abelman, Frayne & Schwab

(57) ABSTRACT

A liquid processing apparatus supplies a processing liquid from a nozzle formed on an irrotational member to a substrate while the substrate is rotated horizontally, with a back surface of the substrate facing downward. The liquid processing apparatus prevents droplets from remaining on the member. The liquid processing apparatus includes a nozzle member irrotationally provided below the substrate. The nozzle member includes a processing-liquid discharge nozzle to discharge the processing liquid and a gas discharge nozzle to discharge drying gas on a top surface of the nozzle member. The processing-liquid discharge nozzle includes a processing-liquid discharge port to discharge the processing liquid toward the substrate. The gas discharge nozzle includes a first gas discharge port to discharge the drying gas toward the substrate, and a plurality of second gas discharge ports to discharge the drying gas in a radial direction along the top surface of the nozzle member.

3 Claims, 7 Drawing Sheets

US 8,696,863 B2

LIQUID PROCESSING APPARATUS AND LIQUID PROCESSING METHOD

This application is based on and claims priority from Japanese Patent Application No. 2009-029772, filed on Feb. 12, 2009, with the Japanese Patent Office, the disclosure of which is incorporated herein in its entirety by reference.

TECHNICAL FIELD

The present disclosure relates to a liquid processing apparatus and a liquid processing method to perform liquid processing on a substrate, such as a semiconductor wafer.

BACKGROUND

In a process of fabricating a semiconductor device or a flat panel display (FPD), a processing liquid is supplied to a to-be-processed substrate, such as a semiconductor wafer or a glass substrate to perform liquid processing, such as cleaning or etching.

As such a liquid processing apparatus, there is a single-type processing apparatus to perform liquid processing for a substrate, such as a semiconductor wafer by supplying a processing liquid to the front or back surface of the wafer while the substrate is held and rotated.

There is an apparatus for performing liquid processing by supplying a processing liquid to the back surface of a substrate. The apparatus includes a spin chunk holding the substrate through a holding member in a state where the back surface of the substrate faces downward, and an irrotational discharge hole upwardly discharging a chemical liquid, deionized water, and $N_2$ gas to the back surface of the substrate. While the substrate is rotated, the apparatus performs liquid processing for the back surface of the substrate by supplying the chemical liquid from the discharge hole and rinsing processing by supplying the deionized water from the discharge hole, and then dries the substrate by blowing $N_2$ gas upwardly from the discharge hole. For example, see Japanese Laid-Open Patent Publication No. 2003-45839.

However, in such an apparatus, since a member having the discharge hole is not rotated, droplets of the chemical liquid or the deionized water may remain on the member after the rinsing processing. Also, since the droplets are not removed by blowing $N_2$ gas, the droplets may have a bad influence on the processing of the subsequent substrate. For example, when the droplets consists of a chemical liquid, the chemical liquid sublimates to form a chemical-liquid atmosphere and the atmosphere has a bad influence on the substrate. Also, as disclosed in Japanese Laid-Open Patent Publication No. Hei 9-298181, when a substrate is moved up and down by a member provided with a nozzle for discharging a chemical liquid or gas to the back surface of the substrate, the droplets attached to the member provided with the nozzle are transferred to the back surface of the substrate, thereby having a bad influence on the substrate.

SUMMARY

According to one embodiment, there is provided a liquid processing apparatus to perform liquid processing by supplying a processing liquid to a substrate. The apparatus includes a substrate holding mechanism to rotatably hold the substrate in a horizontal state, a rotation mechanism to rotate the substrate holding mechanism, and a nozzle member irrotationally provided below the substrate. The nozzle member includes a processing-liquid discharge nozzle to discharge the processing liquid and a gas discharge nozzle to discharge drying gas on a top surface of the nozzle member. The apparatus also includes a processing-liquid supply mechanism to supply the processing liquid to the processing-liquid discharge nozzle, and a gas supply mechanism to supply the drying gas to the gas discharge nozzle. The processing-liquid discharge nozzle includes a processing-liquid discharge port to discharge the processing liquid toward the substrate. The gas discharge nozzle includes a first gas discharge port to discharge the drying gas toward the substrate, and a plurality of second gas discharge ports to discharge the drying gas in a radial direction along the top surface of the nozzle member.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
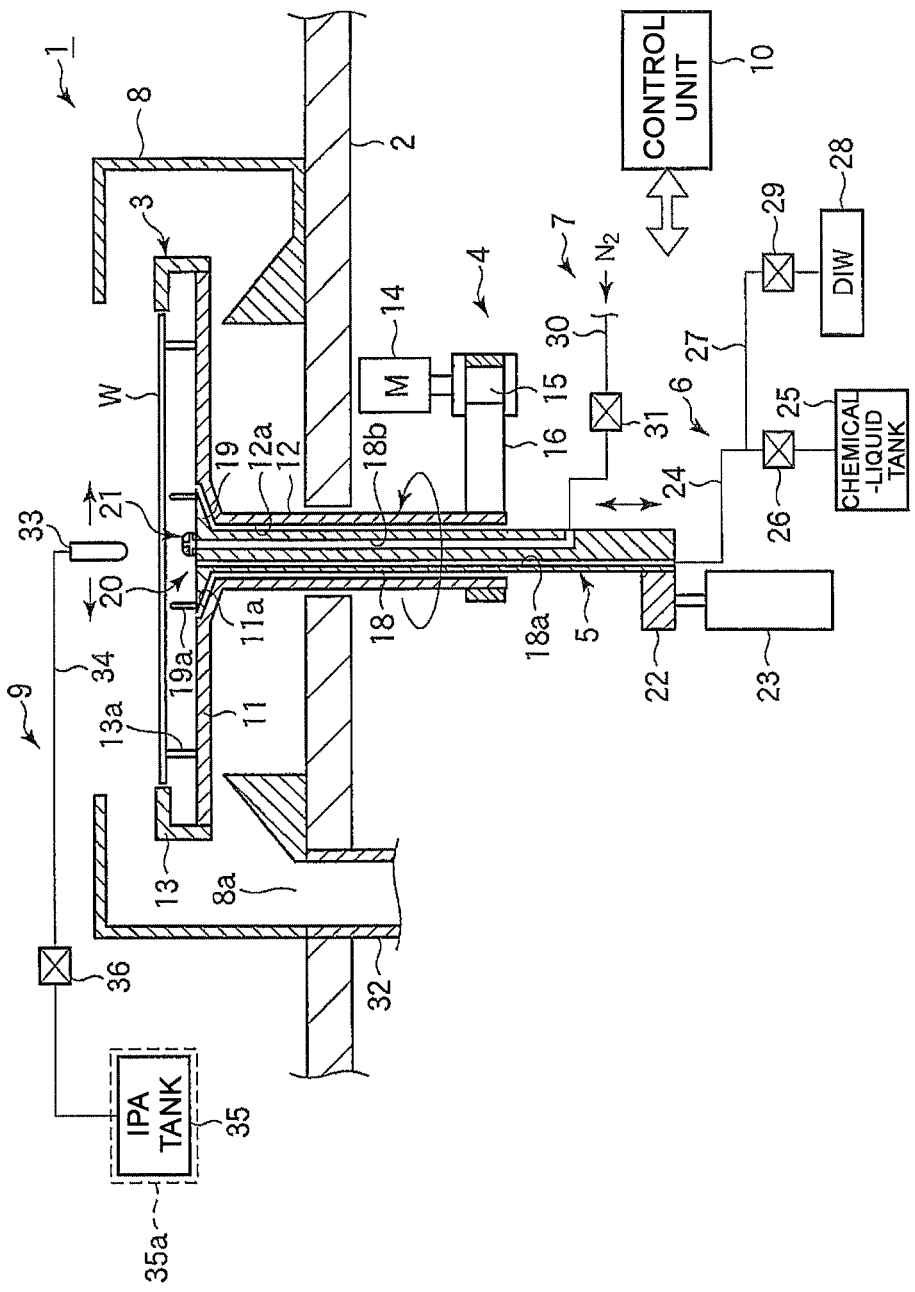
FIG. 1 is a cross-sectional view schematically illustrating a liquid processing apparatus according to one embodiment of the present disclosure.

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

The present disclosure provides a liquid processing apparatus and a liquid processing method to perform processes by supplying a processing liquid from a nozzle formed on an irrotational member to a substrate while the substrate is rotated. The liquid processing apparatus and method can prevent droplets from remaining on the member having the nozzle in the processing apparatus.

According to one embodiment, there is provided a liquid processing apparatus to perform liquid processing by supplying a processing liquid to a substrate. The apparatus includes a substrate holding mechanism to rotatably hold the substrate in a horizontal state, a rotation mechanism to rotate the substrate holding mechanism, and a nozzle member irrotationally provided below the substrate. The nozzle member includes a processing-liquid discharge nozzle to discharge the processing liquid and a gas discharge nozzle to discharge drying gas on a top surface of the nozzle member. The apparatus also includes a processing-liquid supply mechanism to supply the processing liquid to the processing-liquid discharge nozzle, and a gas supply mechanism to supply the drying gas to the gas discharge nozzle. The processing-liquid discharge nozzle includes a processing-liquid discharge port to discharge the processing liquid toward the substrate. The gas discharge nozzle includes a first gas discharge port to discharge the drying gas toward the substrate, and a plurality of second gas discharge ports to discharge the drying gas in a radial direction along the top surface of the nozzle member.

The rotation mechanism may rotate the substrate holding mechanism through a hollow-shaped rotation shaft extending vertically. The nozzle member may include a head part and a through-flow part. The head part has the processing-liquid discharge nozzle and the gas discharge nozzle. The through-flow part extends vertically within the rotation shaft and has a processing-liquid through-flow path and a gas through-flow path to supply the processing liquid and the drying gas upwardly to the processing-liquid discharge nozzle and the gas discharge nozzle, respectively.

Also, the apparatus may further include an elevating mechanism to move the nozzle member up and down. The head part may have a substrate supporting part to support the substrate on the head part. When the nozzle member is moved up to a carrying position, the substrate may be exchanged on the substrate supporting part. The nozzle member may be positioned at a descending position during processing of the substrate and may move up to move the substrate to the carrying position after the processing.

The processing-liquid discharge nozzle and the gas discharge nozzle may be provided adjacently to each other. When the drying gas is discharged from the gas discharge ports of the gas discharge nozzle during the discharge of the processing liquid from the processing-liquid discharge port of the processing-liquid discharge nozzle, a mist of the processing liquid may be formed.

The apparatus may further include a drying solvent supply mechanism to supply a high-temperature drying solvent on the front surface of the substrate.

According to another embodiment, there is provided a liquid processing method to perform liquid processing by supplying a processing liquid on a substrate using a liquid processing apparatus. The apparatus includes a nozzle member irrotationally provided below the substrate. The nozzle member has a processing-liquid discharge nozzle to discharge the processing liquid and a gas discharge nozzle to discharge drying gas on a top surface of the nozzle member. The method includes holding the substrate in a horizontal state, processing the substrate with the processing liquid by discharging the processing liquid upwardly from the processing-liquid discharge nozzle while the substrate is rotated in the horizontal state, and drying the substrate and the top surface of the nozzle member by discharging the drying gas from the gas discharge nozzle toward the substrate and discharging the drying gas in a radial direction along the top surface of the nozzle member while the substrate is rotated after the processing.

The processing with the processing liquid may further include firstly processing the substrate with a chemical liquid as the processing liquid and secondly processing the substrate with deionized water as the processing liquid.

The processing with the processing liquid may further include processing a back surface of the substrate with a mist of the deionized water generated through the discharge of the drying gas from the gas discharge nozzle during the discharge of the deionized water from the processing-liquid discharge nozzle after the second processing.

The method may further include drying the front surface of the substrate by supplying a high-temperature drying solvent on the front surface of the substrate during the drying of the substrate and the top surface of the nozzle member.

In the present disclosure, a nozzle member is irrotationally provided below the substrate. The nozzle member includes a processing-liquid discharge nozzle and a gas discharge nozzle provided on a top surface of the nozzle member to discharge a processing liquid and drying gas, respectively. The gas discharge nozzle includes a first gas discharge port to discharge the drying gas toward the substrate, and a plurality of second gas discharge ports to discharge the drying gas in a radial direction along the top surface of the nozzle member. While the drying gas is discharged from the first gas discharge port to dry the back surface of the substrate, the drying gas is discharged in a radial direction from the second gas discharge ports, thereby preventing droplets from remaining on the top surface of the nozzle member. Therefore, it can be avoided to have a bad influence on the substrate by the remaining of the droplets.

Hereinafter, an embodiment of the present disclosure will be described in detail with reference to drawings.

FIG. 1 is a cross-sectional view schematically illustrating a liquid processing apparatus according to one embodiment of the present disclosure. In the description below, a semiconductor wafer (hereinafter, referred to as a wafer) is used as a substrate and the back surface of the wafer is cleaned.

A liquid processing apparatus 1 includes a chamber (not shown), a base plate 2 functioning as a base of the chamber, a spin chuck (a substrate holding mechanism) 3 provided within the chamber, a rotation mechanism 4 to rotate spin chuck 3, a nozzle member 5 to discharge a processing liquid and drying gas, a processing-liquid supply mechanism 6 to supply a processing liquid to nozzle member 5, a gas supply mechanism 7 to supply drying gas to nozzle member 5, a drain cup 8 to receive a drained liquid, a high-temperature IPA (isopropyl alcohol) supply mechanism 9 to supply high-temperature IPA (isopropyl alcohol) as a high-temperature drying solvent to the front surface of a wafer W, and a control unit 10.

Spin chuck 3 includes a rotation plate 11, a rotation shaft 12 connected to the center of rotation plate 11, supporting pins 13a provided on the front surface of rotation plate 11 to support wafer W in the state where wafer W rises from rotation plate 11, and a ring-shaped guide ring 13 provided at the circumferential periphery of rotation plate 11 to guide wafer W. Also, spin chuck 3 horizontally holds wafer W in the state where the back surface of wafer W faces downward. When wafer W is held, wafer W is supported by supporting pins 13a and is rotated, so that wafer W is held by a differential pressure that is generated between the top surface and the bottom surface of wafer W. Herein, the back surface of wafer W refers to the surface on which a device of wafer W is not formed.

Rotation mechanism 4 includes a motor 14, a pulley 15 rotated by motor 14, and a belt 16 wound around pulley 15 and the lower portion of rotation shaft 12. Rotation mechanism 4 is configured so that the rotation of motor 14 rotates rotation shaft 12 through pulley 15 and belt 16.

Rotation shaft 12 extends downward through cylindrical (hollow-shaped) base plate 2. A cone-shaped hole 11a is formed in the center of rotation plate 11. Hole 11a communicates with a hole 12a within rotation shaft 12. Nozzle member 5 is provided so that nozzle member 5 can move up and down within holes 12a and 11a.

Figure 2:
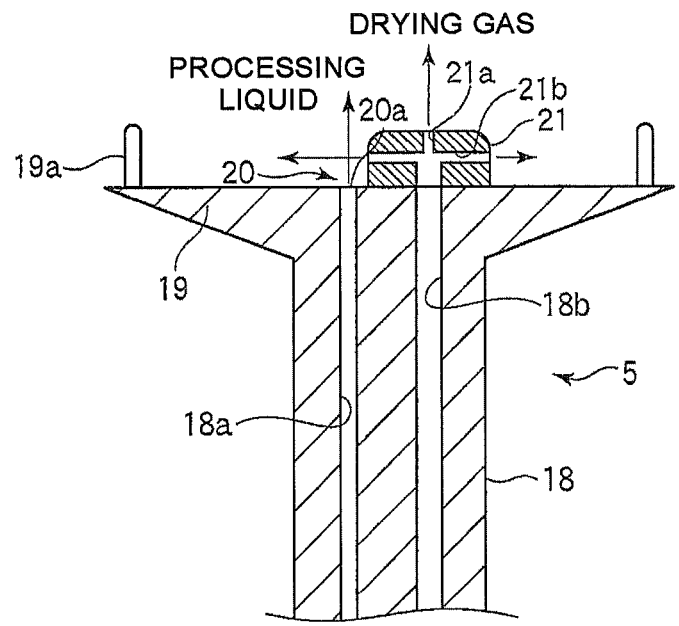
FIG. 2 is a cross-sectional view illustrating a nozzle member used for the liquid processing apparatus shown in FIG. 1.
Figure 3:
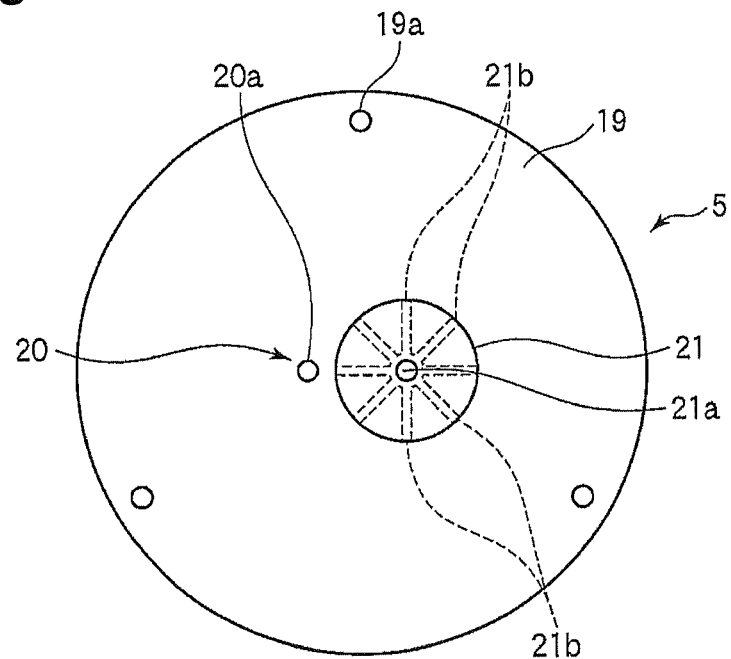
FIG. 3 is a plan view illustrating the nozzle member used for the liquid processing apparatus shown in FIG. 1.

As shown in FIGS. 2 and 3, nozzle member 5 is irrotational. Nozzle member 5 includes a cup-shaped head part 19 constituting a supporting member to support wafer W, and a through-flow part 18 extending vertically downward from head part 19. Also, during the processing of wafer W, through-flow part 18 is located within hole 12a inside of rotation shaft 12 and head part 19 is located within hole 11a.

A processing-liquid through-flow path 18a and a gas through-flow path 18b are vertically provided within through-flow part 18 and head part 19. A processing-liquid discharge nozzle 20 is provided at the position on the top surface of head part 19 corresponding to processing-liquid through-flow path 18a. Processing-liquid discharge nozzle 20 discharges a processing liquid. A gas discharge nozzle 21 is provided at the position on the top surface of head part 19 corresponding to gas through-flow path 18b. Gas discharge nozzle 21 discharges drying gas. A processing liquid is supplied from processing-liquid supply mechanism 6 to the lower portion of processing-liquid through-flow path 18a and supplied upwardly to processing-liquid discharge nozzle 20 via processing-liquid through-flow path 18a. Drying gas is supplied from gas supply mechanism 7 to the lower portion of gas through-flow path 18b and supplied upwardly to gas discharge nozzle 21 via gas through-flow path 18b.

Processing-liquid discharge nozzle 20 includes a processing-liquid discharge port 20a. Processing-liquid discharge port 20a extends from processing-liquid through-flow path 18a and discharges a processing liquid upwardly. Also, Gas discharge nozzle 21 includes a single first gas discharge port 21a to upwardly discharge drying gas, and a plurality of second gas discharge ports 21b (the number of second gas discharge ports 21b is eight in the drawings) to discharge drying gas in a radial direction along the top surface of head part 19. Second gas discharge ports 21b extends from gas through-flow path 18b.

Nozzle member 5 also functions as a wafer elevating member. Three wafer supporting pins 19a are provided on the top surface of head part 19 constituting the supporting member. A cylinder mechanism 23 is connected with the lower end of nozzle member 5 via a connecting member 22. Cylinder mechanism 23 moves nozzle member 5 up and down, thereby allowing wafer W to be loaded and unloaded.

Processing-liquid supply mechanism 6 includes a processing-liquid supply conduit 24 connected to the lower end of processing-liquid through-flow path 18a of nozzle member 5, a chemical-liquid tank 25 connected to processing-liquid supply conduit 24 to store a chemical liquid, an opening/closing valve 26 provided at processing-liquid supply conduit 24, a deionized-water supply conduit 27 connected to a downstream area of valve 26 of processing-liquid supply conduit 24 to supply deionized water as a rinsing liquid, a deionized-water source 28 connected to deionized-water supply conduit 27 to supply deionized water DIW, and an opening/closing valve 29 provided at deionized-water supply conduit 27. A chemical liquid stored in chemical-liquid tank 25 and deionized water from deionized-water source 28 are supplied as processing liquids to processing-liquid through-flow path 18a of nozzle member 5.

Diluted hydrofluoric acid (DHF, an acidic chemical liquid), or ammonia-hydrogen peroxide solution (SC1, an alkaline chemical liquid) may be used as the chemical liquid.

Gas supply mechanism 7 includes a gas supply conduit 30 connected to the lower end of gas through-flow path 18b of nozzle member 5. Gas supply conduit 30 extends from a gas source (not shown). Also, Gas supply mechanism 7 includes an opening/closing valve 31 provided at gas supply conduit 30. Gas supply mechanism 7 is configured so that drying gas, such as $N_2$ gas, is supplied to gas through-flow path 18b of nozzle member 5 via gas supply conduit 30.

Drain cup 8 surrounds the circumferential periphery of wafer W held by rotation plate 11 at the outside of rotation plate 11 and has a function of receiving a drained liquid scattered from wafer W. A drain hole 8a is formed at the bottom of drain cup 8. A drain conduit 32 is connected to drain hole 8a and extends downward.

High-temperature IPA supply mechanism 9 includes a scannable high-temperature IPA discharge nozzle 33 to discharge high-temperature IPA on the front surface of wafer W, a high-temperature IPA supply conduit 34 connected to high-temperature IPA discharge nozzle 33, and a high-temperature IPA tank 35 connected to high-temperature IPA supply conduit 34. An opening/closing valve 36 is provided at high-temperature IPA supply conduit 34. A heater 35a is provided in high-temperature IPA tank 35. A controller (not shown) controls the output of heater 35a, thereby maintaining a temperature of IPA within high-temperature IPA tank 35. The high-temperature IPA used in the present disclosure is in a liquid state, and has a temperature higher than 40° C. and lower than the boiling point.

Also, a chemical-liquid discharge nozzle and a deionized-water discharge nozzle (both not shown) are provided above wafer W. The chemical-liquid discharge nozzle and deionized-water discharge nozzle are connected to chemical-liquid tank 25 and deionized-water source 28 via conduits, and are configured so that they can supply a chemical liquid and deionized water (as a rinsing liquid) on the front surface of wafer W.

Figure 4:
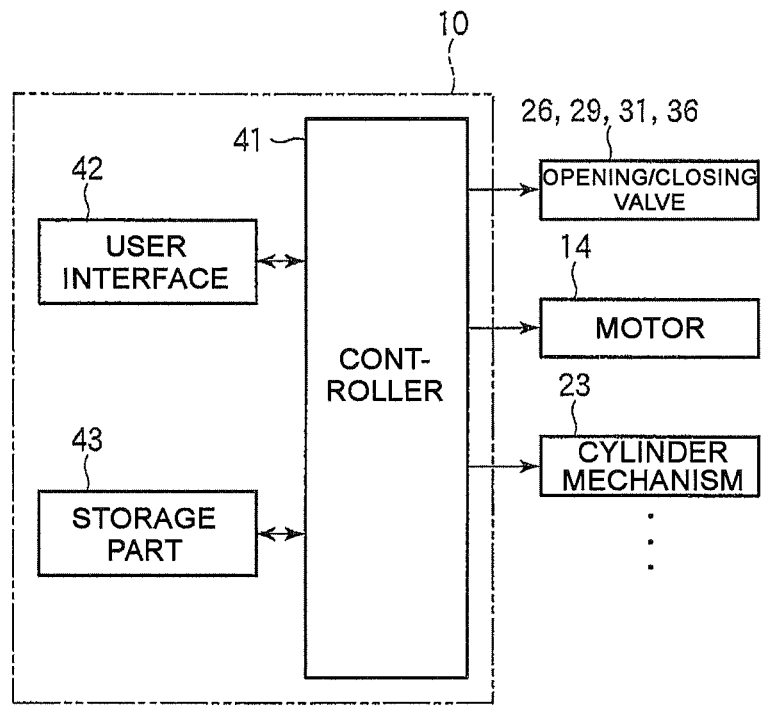
FIG. 4 is a block diagram illustrating a control unit provided in the liquid processing apparatus shown in FIG. 1.

Control unit 10, as shown in the block diagram of FIG. 4, includes a controller 41, a user interface 42, and a storage part 43. The controller 41 includes a microprocessor (computer), and controls respective components of liquid processing apparatus 1, such as opening/closing valves 26, 29, 31, and 36, motor 14, and cylinder mechanism 23. User interface 42 is connected to controller 41, and includes a keyboard allowing an operator to input commands for managing liquid processing apparatus 1, and a display to visualize and show the running state of liquid processing apparatus 1. Storage part 43 is also connected to controller 41, and stores a processing recipe, such as a program for controlling to-be-controlled objects of the respective components of liquid processing apparatus 1, or a program for allowing liquid processing apparatus 1 to perform certain processes. The processing recipe is stored in a central storage medium (not shown) of storage part 43. The storage medium may be a fixed-type medium, such as hard disk, or a transferable-type medium, such as CD-ROM, DVD, or flash memory. Also, the recipe may be appropriately transmitted from another device, for example, via a dedicated line. Also, controller 41, as required, calls any processing recipe from storage part 43 in accordance with the instruction from user interface 42, and executes it, thereby performing certain processes under the control of controller 41.

Hereinafter, the operation of a cleaning process on the back surface of wafer W by liquid processing apparatus 1 will be described. FIGS. 5 to 12 are views illustrating the operation of such a cleaning process.

Figure 5:
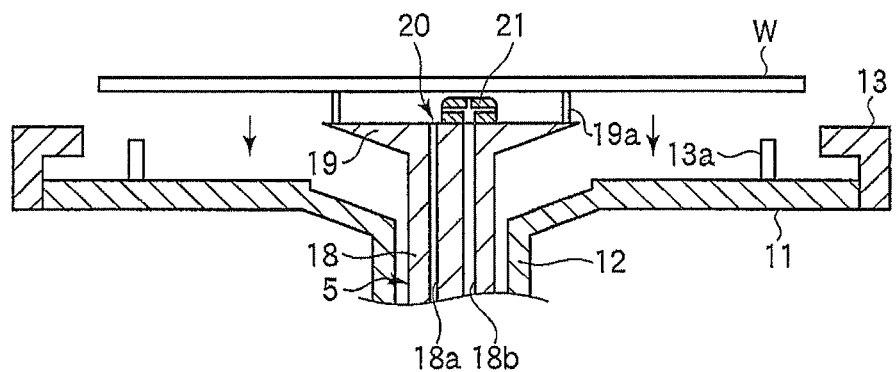
FIG. 5 is a view illustrating the state where a wafer is loaded in the liquid processing apparatus shown in FIG. 1.
Figure 6:
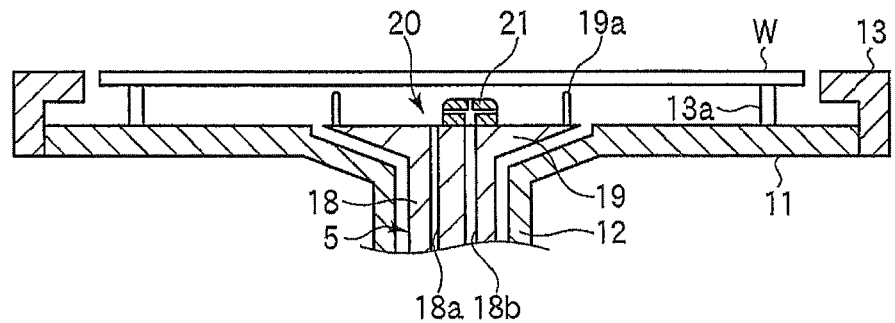
FIG. 6 is a view illustrating the state where a wafer is mounted in a spin chuck in the liquid processing apparatus shown in FIG. 1.

First, as shown in FIG. 5, in the state where nozzle member 5 is moved up, wafer W is transferred on supporting pins 19a of head part 19 from a carrying arm (not shown). Then, as shown in FIG. 6, nozzle member 5 is moved down and the position of wafer W is determined by guide member 13. Supporting pins 13a support wafer W in a state where wafer W rises from rotation plate 11.

Figure 7:
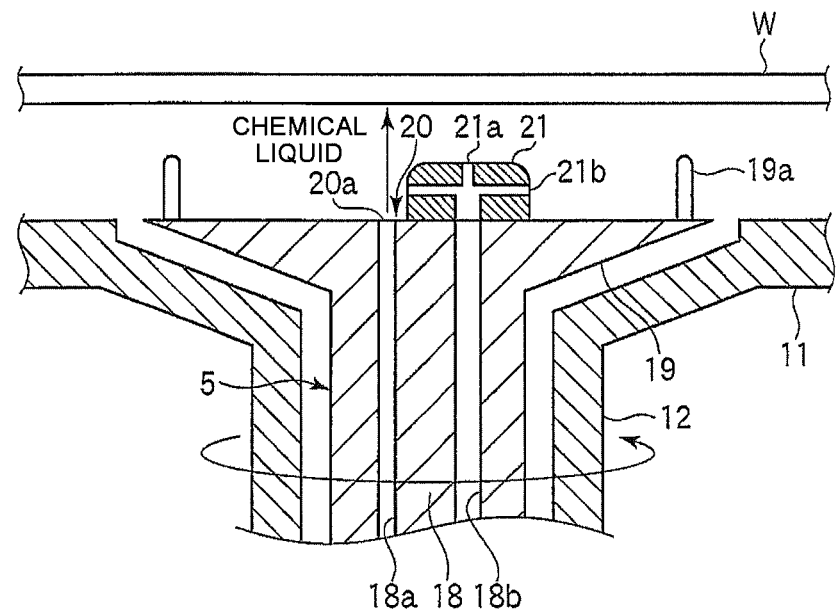
FIG. 7 is a view illustrating the state where a chemical-liquid processing is performed in the liquid processing apparatus shown in FIG. 1.

In this state, as shown in FIG. 7, wafer W is rotated together with spin chuck 3 by rotation mechanism 4 and a chemical liquid is discharged from discharge port 20a formed in processing-liquid discharge nozzle 20 of nozzle member 5, thereby supplying the chemical liquid to the back surface of wafer W to perform a cleaning process. Herein, the rotation speed of wafer W is within a range of 800 rpm to 1000 rpm.

Figure 8:
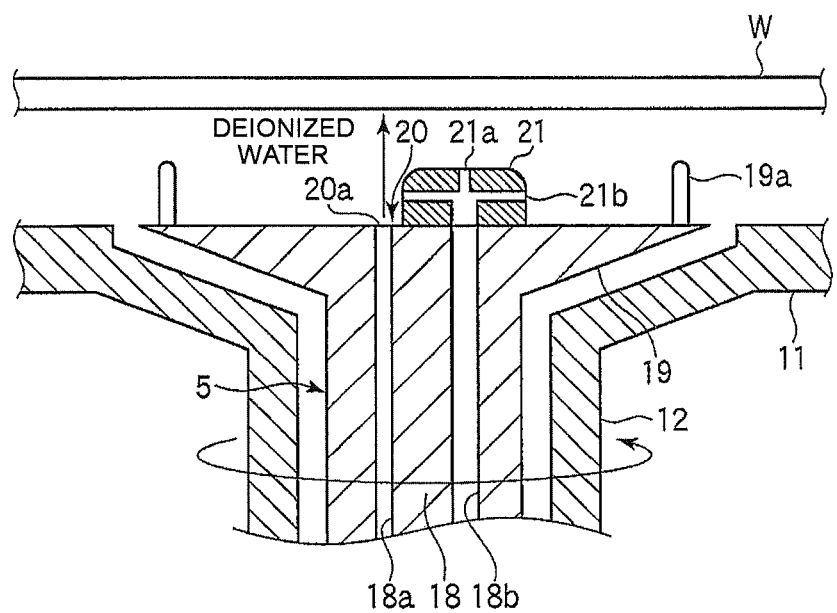
FIG. 8 is a view illustrating the state where a rinsing processing is performed in the liquid processing apparatus shown in FIG. 1.

After the completion of the cleaning process by such a chemical liquid, the supply of the chemical liquid is stopped. Then, as shown in FIG. 8, while wafer W is rotated at a rotation speed in the range of 800 rpm to 1000 rpm, deionized water DIW as a rinsing liquid is discharged from discharge port 20a of processing-liquid discharge nozzle 20, in the same manner as the chemical liquid, thereby supplying the deionized water to the back surface of wafer W to perform a rinsing process.

Figure 9:
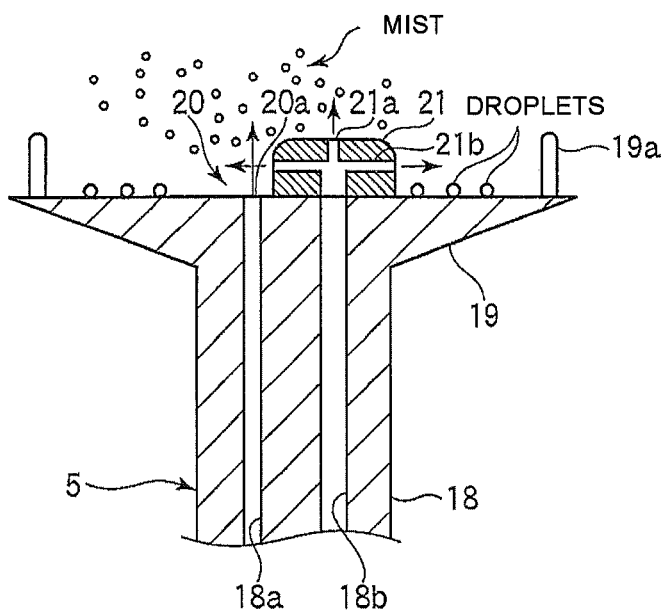
FIG. 9 is a view illustrating the state where a mist processing is performed in the liquid processing apparatus shown in FIG. 1.

Then, as shown in FIG. 9, in a state where the rinsing liquid is discharged during the rotation of wafer W, drying gas, such as $N_2$ gas, is discharged from first gas discharge port 21a and second gas discharge port 21b formed in gas discharge nozzle 21 of nozzle member 5. Since processing-liquid discharge nozzle 20 and gas discharge nozzle 21 are provided adjacently to each other, drying gas discharged along the top surface of head part 19 from second gas discharge port 21b mainly blows deionized water upwardly discharged from processing-liquid discharge port 20a to form a mist of deionized water. Accordingly, the mist is supplied to the top surface of head part 19, and the top surface of head part 19 is cleaned by the mist. However, when the top surface of head part 19 is not required to be cleaned, there is no need to blow the discharged deionized water using drying gas.

Then, while wafer W is rotated at a rotation speed within a range of 800 rpm to 1000 rpm (the same rotation speed as the rotation speed during the mist cleaning), the supply of deionized water is stopped and the supply of drying gas is continued to perform a drying process.

Figure 10:
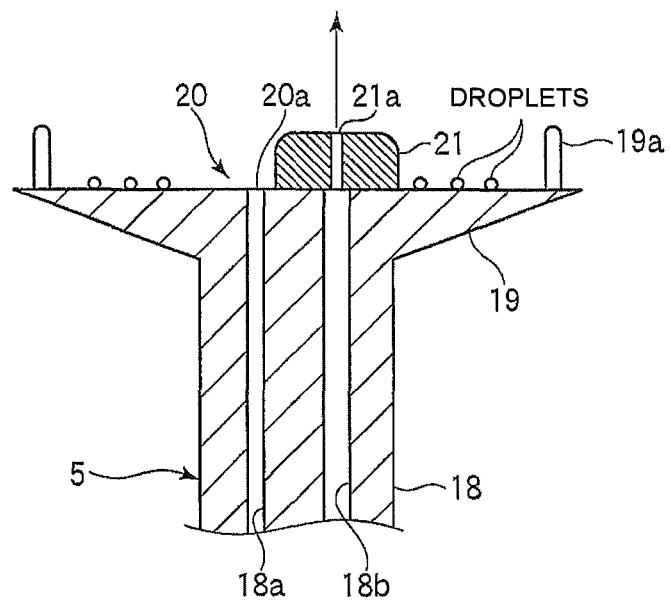
FIG. 10 is a view illustrating the state where a drying processing is performed by discharging drying gas through a conventional gas discharge nozzle.

Herein, as shown in FIG. 10, in drying only the back surface of wafer W, only first gas discharge port 21a may be formed in gas discharge nozzle 21 to discharge gas upwardly. However, in this case, drying gas is hardly supplied on the top surface of head part 19 and the drying for the top surface of head part 19 becomes insufficient. Thus, droplets may remain in the top surface of head part 19.

Figure 11:
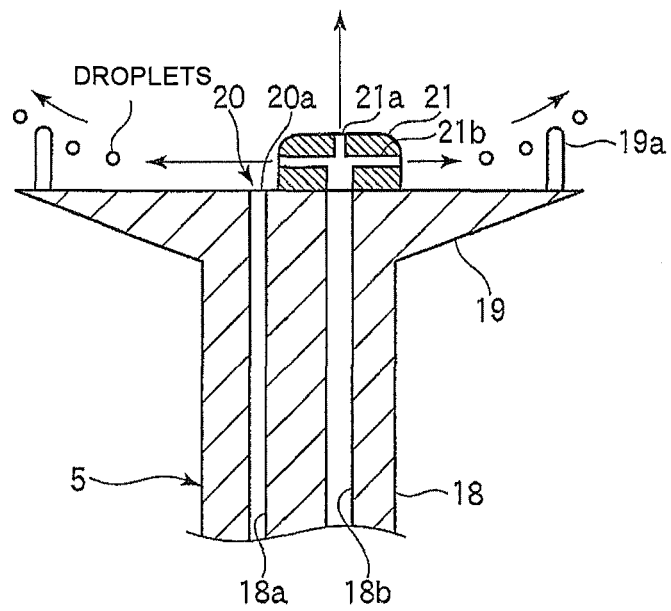
FIG. 11 is a view illustrating the state where a drying processing is performed by discharging drying gas in the liquid processing apparatus shown in FIG. 1.

Therefore, in the present embodiment, as shown in FIG. 11, a plurality of second gas discharge ports 21b (eight second gas discharge ports 21b in the present embodiment) for discharging drying gas in a radial direction along the top surface of head part 19 are formed in gas discharge nozzle 21 in addition to first gas discharge port 21a. Drying gas is discharged from second gas discharge ports 21b, and blows all over the top surface of head part 19, thereby effectively scattering the droplets attached to the top surface of head part 19. Thus, it is possible to dry the top surface of head part 19 so that the droplets can hardly exist.

In a cleaning process on the front surface of wafer W, while the back surface of wafer W is subjected to the chemical-liquid process and the rinsing process, a chemical liquid is discharged from a chemical-liquid discharge nozzle (not shown) provided above the front surface of wafer W to perform the chemical-liquid process on the front surface of wafer W during the rotation of wafer W. Then, deionized water is discharged from a deionized-water discharge nozzle (not shown) to perform a rinsing process on the front surface of wafer W.

Then, as described above, while the back surface of wafer W and the top surface of head part 19 of nozzle member 5 are dried, high-temperature IPA discharge nozzle 33 scans the front surface of wafer W and supplies high temperature IPA to the front surface of wafer W, thereby drying the front surface of wafer W.

Figure 12:
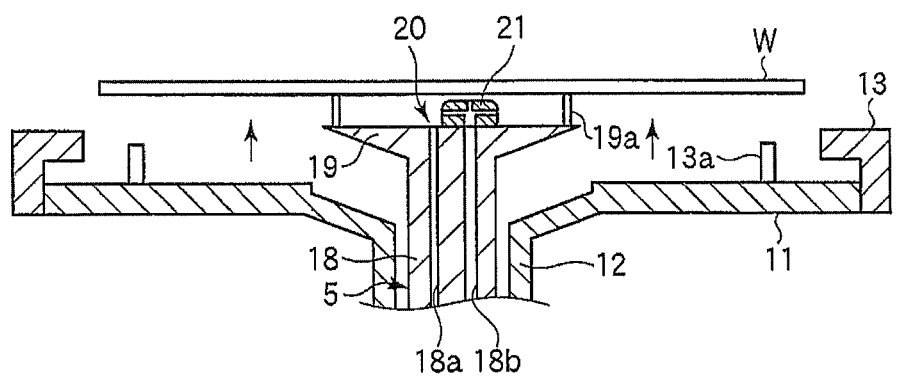
FIG. 12 is a view illustrating the state where a wafer is moved up to be unloaded in the liquid processing apparatus shown in FIG. 1.

After the drying process as described above, wafer W is rotated at a rotation speed within a range of 500 rpm to 1000 rpm and is shake-dried. Then, the rotation of wafer W is stopped. As shown in FIG. 12, when nozzle member 5 is moved up, wafer W is moved up by head part 19 and is unloaded by the carrying arm (not shown)

Also, the present disclosure is not limited to the above-described embodiment, and various modifications can be made. For example, in the embodiment, the number of second gas discharge ports 21b of gas discharge nozzle 21 is eight. However, the present disclosure is not limited thereto, as long as the droplets on the top surface of nozzle member 5 (head part 19) including nozzles can be effectively removed.

Also, in the embodiment, a chemical liquid (such as diluted hydrofluoric acid or sulfuric acid-hydrogen peroxide solution) and a rinsing liquid (such as deionized water) are used as processing liquids in the cleaning process, but the present disclosure is not limited thereto. Any other processing liquids may be applicable to various liquid processes.

Also, in the above-described embodiment, although a semiconductor wafer is used as a to-be-processed substrate, the present disclosure is applicable to any other substrates, such as a substrate for a flat panel display (FPD), for example, a glass substrate for a liquid crystal display device (LCD).

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing apparatus to perform a liquid processing by supplying a processing liquid to a substrate, the apparatus comprising:

a substrate holding mechanism to rotatably hold the substrate in a horizontal state;

a rotation mechanism to rotate the substrate holding mechanism through a hollow-shaped rotation shaft extending vertically;

a nozzle member irrotationally provided below the substrate and including a head part and a through-flow part, the head part including a processing-liquid discharge nozzle to discharge the processing liquid and a gas discharge nozzle to discharge a drying gas on a top surface of the nozzle member;

a processing-liquid supply mechanism to supply the processing liquid to the processing-liquid discharge nozzle; and a gas supply mechanism to supply the drying gas to the gas discharge nozzle, wherein a hole is formed in the substrate holding mechanism and the head part of the nozzle member is located within the hole, the through-flow part extends vertically within the rotation shaft and has a processing-liquid through-flow path and a gas through-flow path to supply the processing liquid and the drying gas upwardly to the processing-liquid discharge nozzle and the gas discharge nozzle, respectively, the processing-liquid discharge nozzle comprises a processing-liquid discharge port to discharge the processing liquid toward the substrate, the gas discharge nozzle comprises a first gas discharge port to discharge the drying gas in a vertical direction toward the substrate, and a plurality of second gas discharge ports distributed within the horizontal plane of which at least two second discharge ports being each directed to an opposite direction to discharge the drying gas in a substantially horizontal direction along the top surface of the nozzle member, thereby blowing the processing liquid remaining on the top surface of the nozzle member after stop discharging the processing liquid, and the processing-liquid discharge nozzle and the gas discharge nozzle are provided adjacently to each other such that the drying gas discharged from one of the plurality of second gas discharge ports along the top surface of the nozzle member blows deionized water discharged from the processing-liquid discharge port to form a mist of deionized water, thereby cleaning the top surface of the nozzle member with the mist.

2. The liquid processing apparatus of claim 1, further comprising an elevating mechanism to move the nozzle member up and down, wherein the head part has a substrate supporting part to support the substrate on the head part, when the nozzle member is moved up to a carrying position, the substrate is exchanged on the substrate supporting part, and the nozzle member is positioned at a descending position during processing of the substrate, and moves up to move the substrate to the carrying position after the processing.

3. The liquid processing apparatus of claim 1, wherein the processing-liquid discharge nozzle and the gas discharge nozzle are provided adjacently to each other, and when the drying gas is discharged from the gas discharge ports of the gas discharge nozzle during the discharge of the processing liquid from the processing-liquid discharge port of the processing-liquid discharge nozzle, a mist of the processing liquid is formed.

* * * * *